United States Patent
Weng

(10) Patent No.: US 7,144,801 B2
(45) Date of Patent: Dec. 5, 2006

(54) BUMPING PROCESS TO INCREASE BUMP HEIGHT

(75) Inventor: Chao-Fu Weng, Tainan (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 215 days.

(21) Appl. No.: 10/874,237

(22) Filed: Jun. 24, 2004

(65) Prior Publication Data

US 2004/0266164 A1    Dec. 30, 2004

(30) Foreign Application Priority Data

Jun. 30, 2003   (TW) .............................. 92117892 A

(51) Int. Cl.
*H01L 21/44* (2006.01)

(52) U.S. Cl. ........................ 438/612; 438/614; 438/687

(58) Field of Classification Search ................ 438/612, 438/613, 614, 648, 650, 685, 686, 687
See application file for complete search history.

(56) References Cited

U.S. PATENT DOCUMENTS

| 6,232,212 B1 * | 5/2001 | Degani et al. ............... 438/612 |
| 6,664,128 B1 * | 12/2003 | Tong et al. .................. 438/614 |
| 6,853,076 B1 * | 2/2005 | Datta et al. .................. 438/737 |
| 6,897,141 B1 * | 5/2005 | Kim ........................... 438/612 |

* cited by examiner

*Primary Examiner*—Kevin M. Picardat
(74) *Attorney, Agent, or Firm*—Bacon & Thomas, PLLC

(57) ABSTRACT

A bumping process mainly comprises the steps of providing a wafer having a plurality of bonding pads, forming a patterned adhesive layer over the bonding pads, forming a barrier layer and a wetting layer on the patterned adhesive layer and the surface of the wafer, removing the barrier layer and the wetting layer not covering the patterned adhesive layer, forming a plurality of bumps on the patterned wetting layer and reflowing the bumps.

20 Claims, 6 Drawing Sheets

BUMPING PROCESS TO INCREASE BUMP HEIGHT

BACKGROUND OF THE INVENTION

1. Field of Invention

This invention relates to a bumping process. More particularly, the present invention is related to a method of increasing the height of bumps without utilizing increasing the thickness of the photo-mask.

2. Related Art

In this information explosion age, integrated circuits products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuits package. Moreover, compared with a wire-bonding package or a tape automated bonding (TAB) package, a flip-chip package has a shorter electrical path on average and a better overall electrical performance. In a flip-chip package, the bonding pads on a chip and the contacts on a substrate are connected together through a plurality of bumps formed by the method of bumping process. Accordingly, the technology of bumping process becomes more and more important in the advanced packaging fields.

As mentioned above, the bumping process mainly comprises forming an under bump metallurgy layer on the bonding pads of the wafer and forming bumps on the under bump metallurgy over the bonding pads. After the wafer with bumps formed thereon is singulated into a plurality of individual bumped chips, the bumped chips are attached to the substrates through bumps respectively. However, when the gap between the bumped chip and the substrate is not small, the bumps connecting the substrate and the chip will bear larger shear stress and more easily damaged for that the coefficient of thermal expansion (CTE) of the chip is different from that of the substrate. In such a manner, forming higher bumps to have a larger gap between the chip and the substrate will have the bumps to be able to bear larger shear stress and enhance the mechanical strength of the bumps.

FIG. 1 to FIG. 4 are partially enlarged cross-sectional views showing the progression of steps in a conventional method of forming a bump on a surface of a chip.

As shown in FIG. 1, a wafer 100 is provided. The wafer 100 has a passivation layer 102 and a plurality of bonding pads 104 (only one of the bonding pads is shown) exposed out of the passivation layer 102. Next, an under bump metallurgy layer 106 is formed on the wafer 100 to cover the passivation layer 102 and the bonding pads 104. Generally speaking, the under-ball metallurgy layer 106 mainly includes an adhesion layer 106a, a barrier layer 106b and a wetting layer 106c. Then, the, referring to FIG. 2, solder bumps 110 are formed by providing a patterned photo-resist layer 108 on the under bump metallurgy layer 106 to form a plurality of openings 108a to expose the portions over the bonding pads 104 and filling solder material in the openings 108a to dispose on the under bump metallurgy layer 106 not covered by the photo-resist layer 108. Moreover, the volume of the solder bump 110 is increased through utilizing increasing the thickness of the photo-resist layer 108. Therein, the solder material is filled into the opening 108a of the patterned photo-resist layer 108 through electroplating to form higher solder bumps 110 by said thicker photo-resist layer. Generally speaking, the opening 108a of the patterned photo-resist layer 108 is ranged between about 100 μm and about 120 μm in size and the thickness of the photo-resist layer 108 is about 100 μm or about 120 μm.

Next, referring to FIG. 3 and FIG. 4, after photo-resist layer 108 is moved, the solder bumps 110 are taken as a mask to etch the under bump metallurgy layer 106 not covered by the solder bumps 110 to form patterned under bump metallurgy layer 106' until the passivation layer 102 is exposed. Finally, the solder bumps 110 are reflowed to form ball-like solder bumps 112 and enhance the attachment of the ball-like solder bumps 112 to the patterned under bump metallurgy layer 106'.

As we know, the height of the solder bumps after reflowing is pertinent to the volume of the solder material filled into the opening defined by the thickness of the photo-resist layer and the area of the under bump metallurgy for disposing the solder material thereon. Accordingly, when the opening of the patterned photo-resist layer is smaller, there are usually needed more thicker patterned photo-resist layers to be stacked with each other in order to meet the volume of the openings for filling the solder material on condition that the area of the under bump metallurgy layer for disposing the solder material thereon keeps unchanged. However, in photolithography process, it is difficult to form smaller and deeper openings, such as the diameter or width of the opening smaller than 100 μm and the depth of the opening ranged between 100 μm and 140 μm, in the photo-resist layer. Thus, the reliability of forming higher bumps will be lowered.

On the contrary, when the opening of the patterned photo-resist layer becomes larger, the area with solder material disposed thereon to be regarded as the mask for etching the under bump metallurgy will become larger. Accordingly, the area of the patterned under bump metallurgy layer over the bonding pad will become larger and the height of the solder bumps after reflowing will become smaller.

Therefore, providing another method for forming bumps to solve the mentioned-above disadvantages is the most important task in this invention.

SUMMARY OF THE INVENTION

In view of the above-mentioned problems, this invention is to provide a method of forming bumps to increase the height of each bump so as to enhance the mechanical reliability of bumps without increasing the thickness of the photo-resist layer.

To achieve these and other advantages and in accordance with the purpose of the invention, as embodied and broadly described herein, the invention provides a method of forming bumps. Firstly, a wafer having a passivation layer exposing a plurality of bonding pads formed thereon is provided. Next, an adhesive layer and a barrier layer are formed on the wafer in sequence. Then, portions of the barrier layer are removed to leave the patterned barrier layer disposed over the bonding pads. Moreover, a wetting layer is formed on the patterned barrier layer and the adhesive layer. Next, a plurality of bumps are formed on the wetting layer disposed over the bonding pads through forming patterned photo-resist layer with a plurality of openings, filling conductive materials, such as solder materials, into the openings and removing the patterned photo-resist layer. Afterwards, the bumps are taken as masks to remove the portions of the wetting layer not covered by the bumps to form a patterned wetting layer. Then, a reflowing process is performed to shape the bumps into spheres or balls. Finally, the bumps, the patterned barrier layer and the patterned wetting layer are regarded as masks to remove the portions of the adhesive layer to form a patterned adhesive layer.

As mentioned above, the height of each bump formed by the solder material is pertinent to the volume of the opening formed in the patterned photo-resist layer for filling conductive material and the area of the under bump metallurgy layer with conductive material disposed thereon. Accordingly, in this invention, there are needed larger area of the under bump metallurgy with conductive material disposed thereon to reduce the thickness of the patterned photo-resist layer when filling solder material in the openings to meet the predetermined volume. In addition, the height of each bump will become larger due to the reduction of the area of the under bump metallurgy layer with conductive material disposed thereon.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
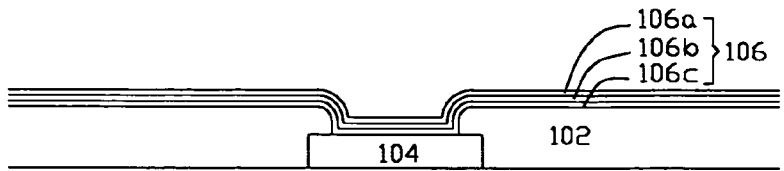
FIGS. 1 to 4 are partially enlarged cross-sectional views showing the progression of steps for forming a bump according to the conventional invention.
Figure 2:
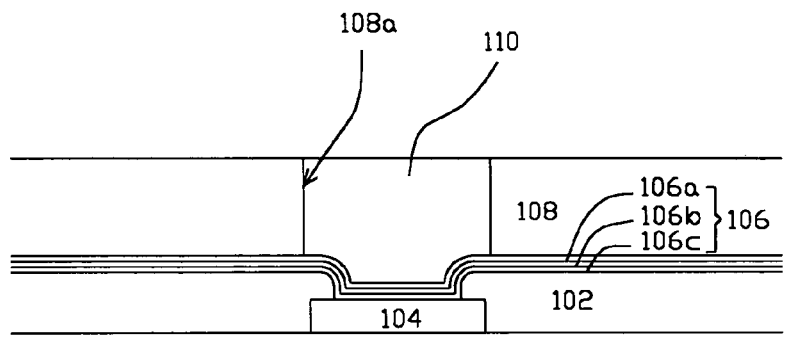
Figure 3:
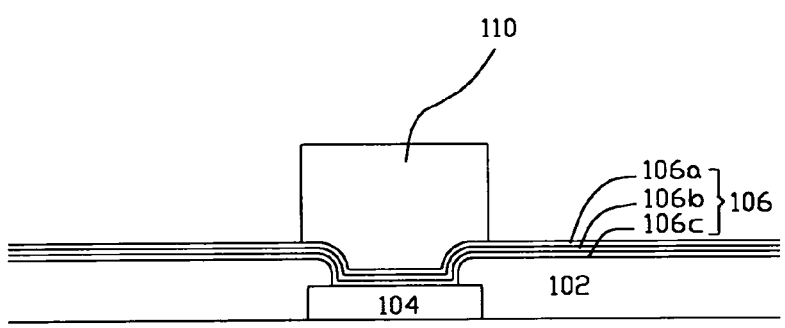
Figure 4:
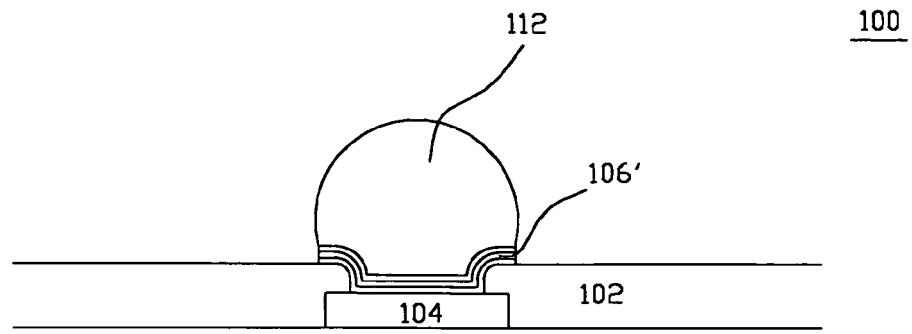

The method of forming bumps according to the preferred embodiment of this invention will be described herein below with reference to the accompanying drawings, wherein the same reference numbers are used in the drawings and the description to refer to the same or like parts.

FIGS. 5 to 12 are partially enlarged cross-sectional views showing the progression of steps for forming a bump according to the preferred embodiment of this invention.

Figure 5:
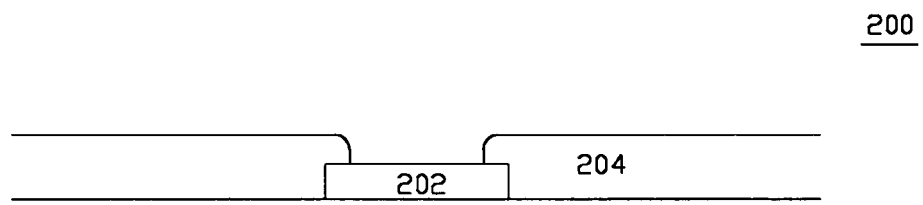
FIGS. 5 to 12 are partially enlarged cross-sectional views showing the progression of steps for forming a bump according to the preferred embodiment of this invention.

Firstly, referring to FIG. 5, a wafer 200 having a plurality of bonding pads 202 (only one of the bonding pads is shown) and a passivation layer 204 is provided. Therein, the passivation layer 204 is formed on the wafer 200 and exposes the bonding pads 202.

Figure 6:
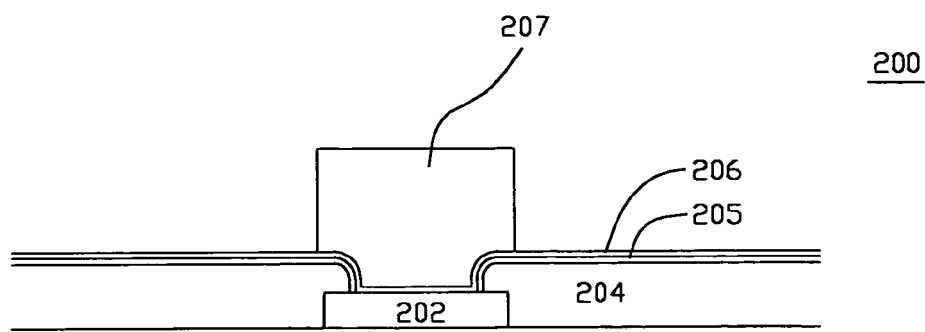

Next, referring to FIG. 6, a dielectric layer 205, such as polyimide (PI) and benzocyclobutene (BCB), is formed on the passivation layer 204 and exposes the bonding pads 202. Afterwards, a first electrically conductive layer 206 is formed on the dielectric layer 205 and covers the bonding pads 202.

Figure 7:
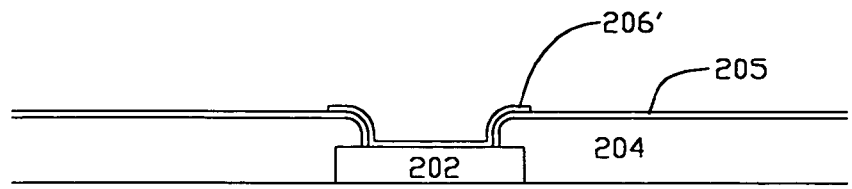

Then, referring to FIG. 6 again, a patterned photo-resist layer 207 is formed on the first electrically conductive layer 206 disposed over the bonding pads 202 so as to take the patterned photo-resist layer 207 as masks to remove portions of the first electrically conductive layer 206. Thus, a patterned first electrically conductive layer 206' is formed over the bonding pads 202 through leaving the potions of the first electrically conductive layer 206 as shown in FIG. 7.

Figure 8:
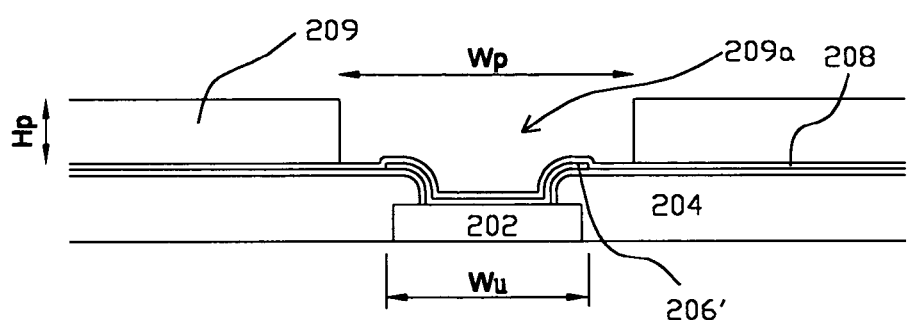

Moreover, referring to FIG. 8, a second electrically conductive layer 208 is formed above the patterned first electrically conductive layer 206' and the dielectric layer 205 and another patterned photo-resist layer 209 is formed above the second electrically conductive layer 208, wherein the patterned photo-resist layer 209 has a plurality of openings 209a therein and located correspondingly to the bonding pads 202 to define the area of the second electrically conductive layer 208 for forming bumps thereon. Therein, the width or diameter Wp of the opening 209a is larger than the width or diameter Wu of the patterned first electrically conductive layer 206' located over the bonding pad 202 and the thickness Hp of the patterned photo-resist layer 209 so as to fill more conductive materials therein. Specifically, the second electrically conductive layer 208 comprises two layers, the barrier layer and the wetting layer. Therein, the barrier layer is formed on the patterned first electrically conductive layer 206' and the dielectric layer 205, and the wetting layer is formed on the barrier layer.

Figure 9:
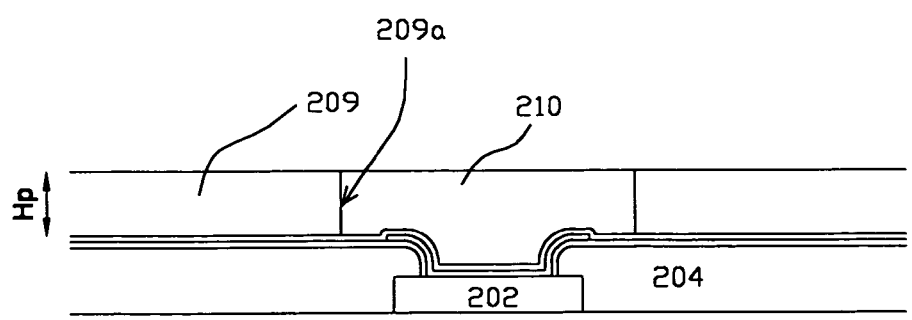

Next, referring to FIG. 9, there is filled the conductive material into the opening 209a to form a bump 210. Therein, the conductive material is filled into the opening 209a through plating method. To be noted, the conductive material can be a solder material. Specifically, the solder material may comprise eutectic solder and lead-free solder. As mentioned, the plating process is performed through patterned first electrically conductive layer 206' electrically connecting the second electrically conductive layer 208.

Figure 10:
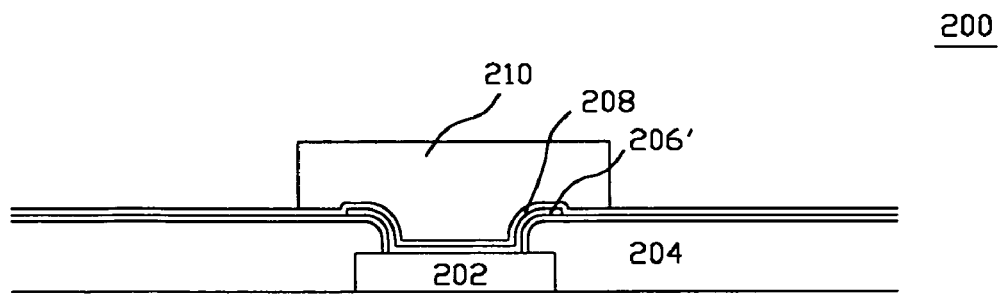
Figure 11:
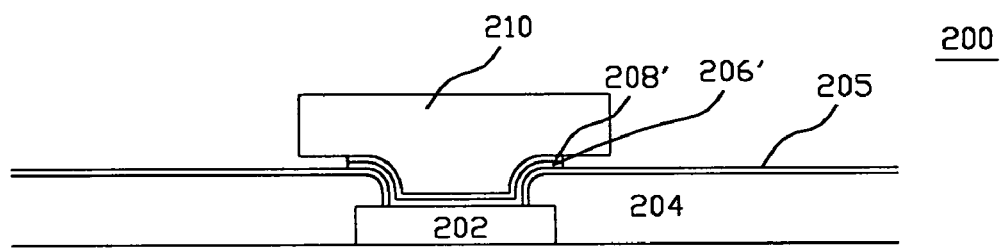

Moreover, referring to FIG. 10 and FIG. 11, after the bump 210 is formed, the patterned photo-resist layer 209 is removed and then the bumps 210 are taken as masks to remove the portions of the second electrically conductive layer 208 not covered by the bumps 210 to expose the dielectric layer 205 to form the patterned second electrically conductive layer 208'. Therein, the patterned first electrically conductive layer 206' is at least covered by the patterned second electrically conductive layer 208'. Namely, the projection area of the patterned first electrically conductive layer 206' over the bonding pad 202 is substantially the same as the projection area of the patterned second electrically conductive layer 208' over the bonding pad 202 and smaller than the projection area of the bump 210 over the bonding pad 202.

Figure 12:
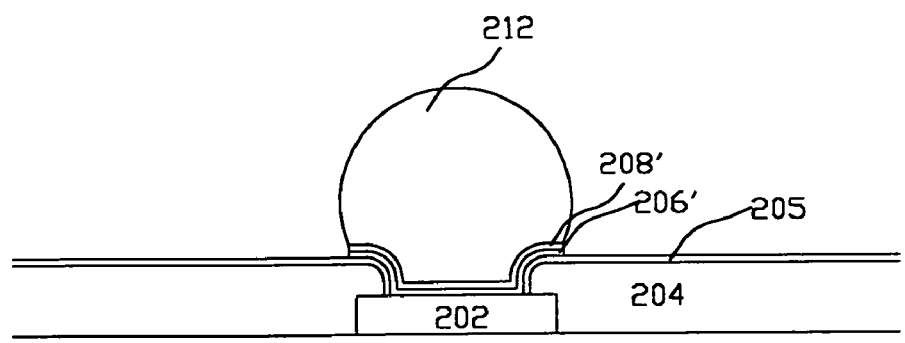
Figure 13:
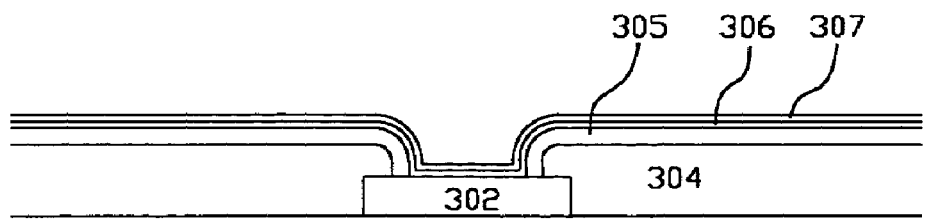
FIGS. 13 to 17 are partially enlarged cross-sectional views showing the progression of steps for forming a bump according to another preferred embodiment of this invention.

Finally, referring to FIG. 12, a reflowing process is performed to shape the bump 210 into the sphere or ball 212.

As mentioned above, when the first electrically conductive layer 206 is an adhesive layer directly attaching to the bonding pad 202, wherein the adhesive layer comprise titanium layer or aluminum layer, and the second electrically conductive layer 202 comprises a barrier layer and a wetting layer, the adhesive layer is firstly formed on the wafer and then the portions of the adhesive layer not coving the bonding pad is removed to form a patterned adhesive layer. Next, the barrier layer and the wetting layer are disposed on the patterned adhesive layer and the dielectric layer in sequence. Next, a bump is formed on the wetting layer and then the portions of the barrier layer and the wetting layer not covered by the bump are removed to form a patterned barrier layer and a patterned wetting layer. Then, a reflowing process is performed to shape the bump into a sphere or a ball.

Finally, the sphere or the ball, the patterned barrier layer and the patterned wetting layer is taken as mask to remove the portions of the adhesive layer to form a patterned adhesive layer. Therein, before the bump is reflowed, the projection area of the patterned barrier layer and the projection area of the patterned wetting layer is substantially the same as the projection area of the patterned adhesive layer and smaller than the projection area of the bump.

Besides, as mentioned above, a first electrically conductive layer can also be deemed as the under bump metallurgy layer, and the second electrically conductive layer is deemed as a bump defined layer for adapting the photo-resist layer to define the volume of the opening for filling the conductive material therein. In other words, firstly, a wafer having an under bump metallurgy layer is provided. Next, a bump defined layer is disposed on the under bump metallurgy layer and above the wafer, and a photo-resist layer is then provided to form a plurality of openings having the size of the opening be larger than the projection area of the under bump metallurgy layer over the bonding pad. Afterwards, the photo-resist layer is removed to have the bump and the under bump metallurgy layer define the bump defined layer. Thus, the area of the patterned bump defined layer over the bonding pad will be substantially the same as that of the under bump metallurgy layer over the bonding pad. Namely, the area of the patterned bump defined layer is substantially the same as that of the under bump metallurgy layer and smaller than the projection area of the bump.

Figure 14:
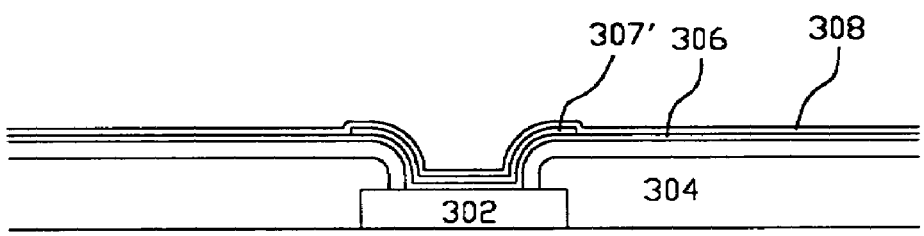
Figure 15:
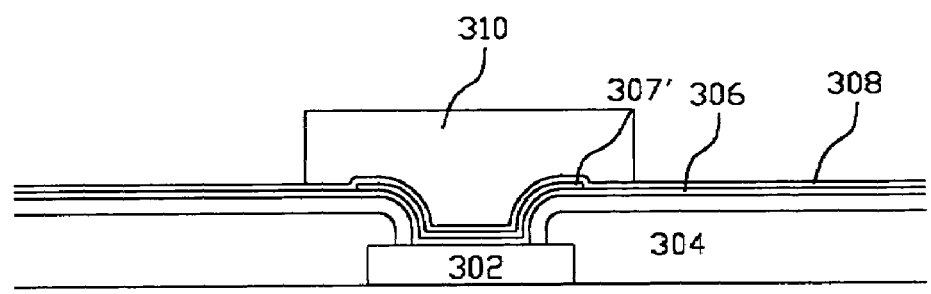
Figure 16:
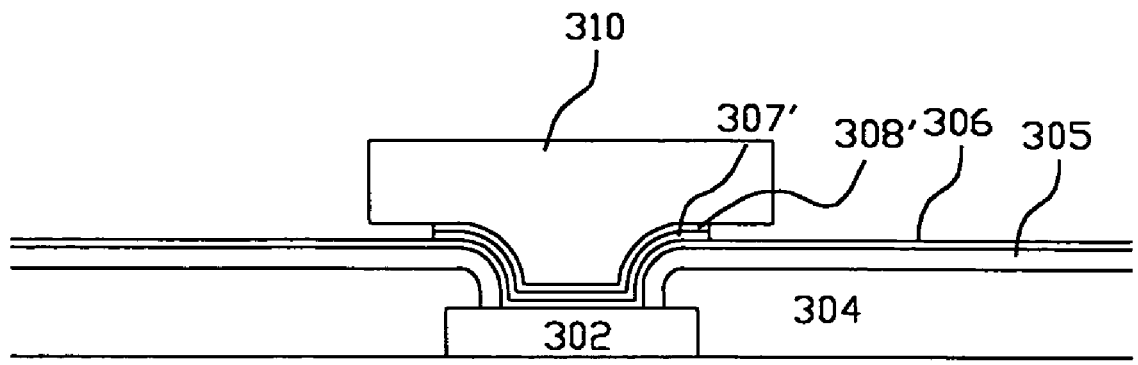
Figure 17:
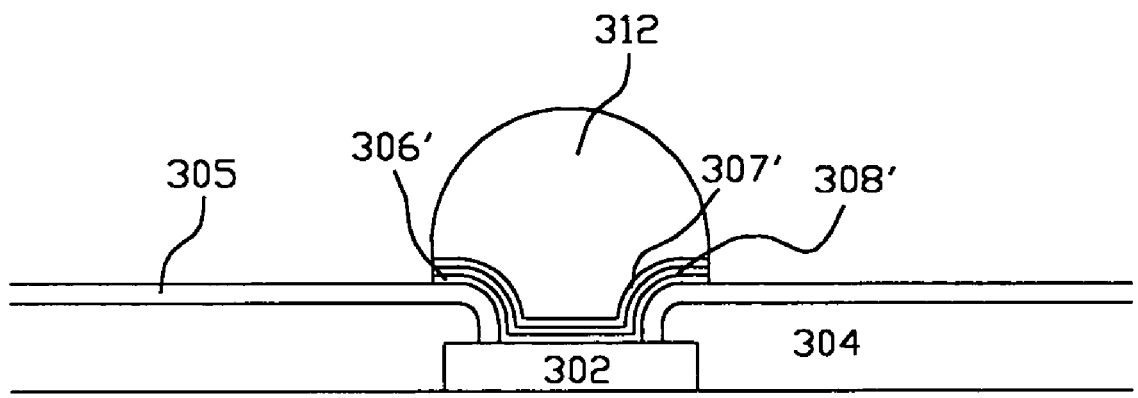

Moreover, referring to FIG. 13 to FIG. 17, when the first electrically conductive layer 306 is an adhesive layer directly attaching to the bonding pad 302, wherein the adhesive layer comprise a titanium layer or an aluminum layer, and the second electrically conductive layer comprises a barrier layer 307 and a wetting layer 308, the adhesive layer 306 and the barrier layer 307 are firstly formed on the wafer 300 and then the portions of the barrier layer 307 not coving the bonding pad 302 is removed to form patterned barrier layer 307'. Next, the wetting layer 308 is disposed on the patterned barrier layer 307' and the adhesive layer 306 layer in sequence as shown in FIG. 14. Next, a conductive bump 310, such as a solder bump, is formed on the wetting layer 308 and then the portions of the wetting layer 308 not covered by the bump 310 are removed to form patterned wetting layer 308' for exposing adhesive layer 306 until the area of the patterned wetting layer 308' over the bonding pad is substantially the same as the area of the patterned barrier layer 307' over the bonding pad. In such a manner, a patterned second electrically conductive layer comprising the patterned barrier layer 307' and patterned wetting layer 308' is formed. Namely, the area of the patterned barrier layer 307' is substantially the same as the area of the patterned wetting layer 308' over the bonding pad and smaller than the area for disposing the bump 310 thereon as shown in FIG. 16.

In addition, a reflowing process is performed to have the bump shape into a sphere or a ball 312. Finally, the sphere or the ball 312, the patterned barrier layer 307' and the patterned wetting layer 308' are taken as mask to remove the portions of the adhesive layer 306 to form a patterned adhesive layer 306'.

In the embodiments as shown above, the height of the bump formed by the conductive or solder material is pertinent to the volume of the opening formed in the patterned photo-resist layer for filling the conductive or solder material and the area of the patterned under bump metallurgy layer over the bonding pad. Accordingly, in this invention, there are provided larger area of the patterned under bump metallurgy over the bonding for disposing bump thereon to reduce the thickness of the photo-resist layer when filling conductive or solder material in the opening to meet the predetermined volume. In addition, the height of the bumps will also beome larger due to the reduction of the area of the patterned under bump metallurgy layer over the bonding pad for disposing thereon.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of forming a plurality of bumps on a wafer having an active surface, wherein the wafer further includes a plurality of bonding pads formed on the active surface and a passivation layer formed on the active surface that exposes the bonding pads, the method comprising the steps of:
   forming an adhesive layer on the bonding pads and the passivation layer;
   forming a barrier layer above the wafer to cover the adhesive layer;
   removing the barrier layer to leave portions of the barrier layer disposed over the bonding pads to form a patterned barrier layer;
   forming a wetting layer above the wafer to cover the patterned barrier layer and the adhesive layer;
   forming a plurality of bumps on portions of the wetting layer located over the bonding pads; and
   removing the wetting layer not covered by the bumps to leave the portions of the wetting layer covered by the bumps so as to form a patterned wetting layer.

2. The method of claim 1, further comprising the steps of removing the adhesive layer to leave portions of the adhesive layer located over the bonding pads through taking the bumps, the patterned barrier layer and the patterned wetting layer as masks.

3. The method of claim 1, wherein the projection area of the patterned barrier layer over the each bonding pad is substantially the same as the projection area of the patterned wetting layer over the each bonding pad and smaller than the projection area of each bumps located over the each bonding pad.

4. The method of claim 1, further comprising the step of performing a reflowing process to shape the bumps into spheres.

5. The method of claim 1, wherein the bumps are formed by the method of solder printing.

6. The method of claim 1, wherein the bumps are formed by the method of solder plating.

7. The method of claim 1, wherein the step of forming a plurality of bumps on portions of the wetting layer located over the bonding pads comprises:
   forming a patterned photo-resist layer above the wetting layer to form a plurality of openings exposing the portions of the wetting layer located over the bonding pads;
   filling a solder material into the openings; and
   removing the patterned photo-resist layer.

8. The method of claim 7, wherein the area of the each opening is larger than the area of the patterned barrier layer located over the each bonding pad.

9. The method of claim 1, further comprising the step of forming a dielectric layer interposed between the adhesive layer and the wafer, wherein the dielectric layer exposes the bonding pads.

10. The method of claim 9, wherein the dielectric layer is made of polyimide.

11. The method of claim 9, wherein the dielectric layer is made of Benzocyclobutene.

12. The method of claim 1, wherein the adhesive layer is made of a material selected from one of titanium, titanium-tungsten, aluminum and chromium.

13. The method claim 1, wherein the barrier layer is made of a material selected from one of nickel-vanadium, nickel, chromium-copper and nickel-titanium.

14. The method of claim 1, wherein the wetting layer is made of copper.

15. A method of forming a plurality of bumps on a wafer having an active surface, wherein the wafer further includes a plurality of bonding pads formed on the active surface and a passivation layer formed on the active surface that exposes the bonding pads, the method comprising the steps of:

forming a first electrically conductive layer on the bonding pads and the passivation layer;

removing the first electrically conductive layer to leave portions of the first electrically conductive layer disposed over the bonding pads to form a patterned first electrically conductive layer;

forming a second electrically conductive layer above the wafer to cover the patterned first electrically conductive layer;

forming a plurality of bumps on portions of the second electrically conductive layer located over the bonding pads; and removing the second electrically conductive layer to leave the portions of the second electrically conductive layer covered by the bumps so as to form a patterned second electrically conductive layer.

16. The method of claim 15, wherein the projection area of the patterned second electrically conductive layer is substantially the same as the projection area of the patterned first electrically conductive layer and smaller than the projection area of the bumps.

17. The method of claim 15, wherein the bumps are formed by the method of solder plating.

18. The method of claim 15, further comprising the step of forming a dielectric layer interposed between the first electrically conductive layer and the wafer, wherein the dielectric layer exposes the bonding pads.

19. The method of claim 15, wherein the first electrically conductive layer is made of a material selected from one of titanium, titanium-tungsten, aluminum and chromium.

20. The method claim 15, wherein the second electrically conductive layer is made of a material selected from one of nickel-vanadium, nickel, chromium-copper and nickel-titanium.

* * * * *